United States Patent
Österberg et al.

[11] Patent Number: 6,029,051
[45] Date of Patent: Feb. 22, 2000

[54] METHOD AND DEVICE FOR MEASURING THE RETURN LOSS OF A RADIOFREQUENCY SIGNAL

[75] Inventors: Magnus Österberg, Täby; Ulf Folkesson, Ingelstad; Gunnar Persson, Spånga, all of Sweden

[73] Assignee: Allgon AB, Akersberga, Sweden

[21] Appl. No.: 08/784,103

[22] Filed: Jan. 15, 1997

[30] Foreign Application Priority Data

Jan. 17, 1996 [SE] Sweden .................................. 9600168

[51] Int. Cl.[7] ........................................................ H04B 1/04
[52] U.S. Cl. ...................... 455/115; 455/226.1; 324/142
[58] Field of Search ...................................... 455/115, 126, 455/127, 129, 226.1, 226.2, 226.3, 62.1; 324/637, 638, 641, 642, 645, 646, 140 R, 140 D

[56] References Cited

U.S. PATENT DOCUMENTS

| | | | |
|---|---|---|---|
| 3,842,358 | 10/1974 | Frazier | 329/129 |
| 3,976,941 | 8/1976 | Milkovic | 324/142 |
| 4,479,087 | 10/1984 | Althouse | 324/140 D |
| 4,493,112 | 1/1985 | Bruene | 455/129 |
| 5,072,189 | 12/1991 | Openlander | 324/638 |
| 5,152,010 | 9/1992 | Talwar | 455/278.1 |
| 5,640,691 | 6/1997 | Davis et al. | 455/115 |
| 5,656,929 | 8/1997 | Humpherys | 455/115 |
| 5,678,209 | 10/1997 | Strakovsky | 455/115 |
| 5,778,308 | 7/1998 | Sroka et al. | 455/115 |

Primary Examiner—Edward F. Urban
Attorney, Agent, or Firm—Jacobson, Price, Holman & Stern, PLLC

[57] ABSTRACT

A method and device for measuring the return loss of a radiofrequency signal at a feeding circuit coupled to a load, wherein the forward power and the reflected power are sensed by a measuring circuit having first and second branches (11, 12) for transferring a derived forward signal and a derived reflected signal, respectively. The return loss is calculated on the basis of the sensed power levels (P1, P2) of the derived signals in the first and second branches. The sensing range of power levels (P2) to be sensed in one branch (12) is adjusted in response to the sensed power level (P1) in the other branch (11), whereby the dynamic range required for power sensing in the measuring circuit is reduced.

16 Claims, 3 Drawing Sheets

METHOD AND DEVICE FOR MEASURING THE RETURN LOSS OF A RADIOFREQUENCY SIGNAL

FIELD OF THE INVENTION

The invention relates to a method and device for measuring the return loss of a radiofrequent signal at a feeding circuit coupled to a load, e.g. an antenna, wherein the forward power and the reflected power are sensed by means of a measuring circuit having first and second branches for transmitting a derived forward signal and a derived reflected signal, respectively, and the return loss is calculated on the basis of the sensed power levels of said derived signals in said first and second branches.

BACKGROUND OF THE INVENTION

In cellular communication systems, there is a need to supervise the operability of base stations, i.a. with regard to the signal strength prevailing at the transmitters and the associated antennas. If the matching of the antenna changes, for example by sabotage or corrosion, a part of the transmitted power is reflected, causing a drop in the signal strength of the cell and, possibly, damage to the transmitter.

It is therefore of great importance to monitor the antenna performance in order to detect degradation and to secure a good quality of communication.

PRIOR ART

A prior art system for measuring the return loss of a radiofrequent signal is illustrated in FIG. 1 of the appended drawings.

A transmitter T is coupled to an antenna A via a feeding circuit F. The transmitter T emits a signal which is transferred as a forward signal Sf through the feeding circuit F towards the antenna A. However, a part of the signal is returned as a reflected signal Sr due to imperfect matching which is inevitable in practice.

In order to sense the forward and reflected signals Sf and Sr, a measuring device 10 is coupled to the feeding circuit F. The device 10 includes a directional coupler DC having two output branches 11, 12. In the first branch 11, a signal S1 corresponding to or derived from the forward signal Sf in the feeding circuit F is generated, which is denoted "derived forward signal" in this specification.

In the second branch 12, there is generated a signal S2 corresponding to or derived from the reflected signal Sr in the feeding circuit F. The signal S2 is denoted "derived reflected signa" herein.

In the first branch 11, there is a forward power sensing circuit 101 for sensing the power P1 (RMS power) of the derived forward signal S1. Correspondingly, in the second branch 12, there is a reflected power sensing circuit 102 for sensing the power P2 of the derived reflected signal S2.

The respective powers P1 and P2 are measured in a logarithmic scale in dBm. Therefore, by subtracting one logarithmic power value from the other, one obtains a measure of the relative magnitude or quotient of the absolute power levels, denoted "return loss" RL:

$$RL = P2/P1$$

$$RL(DB) = P1(dBm) - P2(dBm)$$

Since the quotient P2/P1 of the power levels of the derived signals at the output of the measuring circuit is equal to the quotient of the input power levels of the reflected and forward signals Sr and Sf, the measured return loss value RL is a relevant measure of the relative power levels in the feeding circuit F being monitored.

However, in many systems, such as GSM and PCS systems being used frequently today, the transmitter power level varies considerably. Consequently, the dynamic range $\Delta P2$ required for sensing the reflected power will add up to very large values:

$$\Delta P2 = P2_{max} - P2_{min} \text{ (dB)}$$

where $$P2_{max} = P1_{max} - \Delta RL_{min} \text{ (dB)}$$

$$P2_{min} = P1_{min} - \Delta RL_{max} \text{ (dB)}$$

Therefore $$\Delta P2 = P1_{max} - P1_{min} + \Delta RL_{max} - \Delta RL_{min} \text{ (dB)}$$

$$\Delta P2 = \Delta P1 + \Delta RL$$

Thus, the sensing ranges of P1 and RL are added. Typically, $\Delta P1$ is as large as 30 dB and $\Delta RL$ may be 20 dB. As a result the total dynamic range required for sensing reflected power may be 50 dB, or even larger.

It is very difficult to cope with such a large dynamic range in the reflected power sensing circuit 102 in FIG. 1. In practice, this problem has been solved by dividing the branch 12 into a number of separate sub-branches (not shown), each with its own gain and associated detector circuitry. Such a solution is of course rather complicated and expensive.

SUMMARY OF THE INVENTION

The main object of the present invention is to provide a method and a device for measuring the return loss within a large power range in a much simpler and less expensive manner, without necessitating circuitry having detectors with an extremely high dynamic range capability.

Further objects are to provide very simple sensing circuits with a small number of inexpensive components, to minimize temperature drift and to provide a reliable measuring device having a long life.

The stated main object is achieved in that the sensing range of power levels to be sensed in one branch of the measuring circuit, normally in the branch for sensing reflected power, is adjusted in response to the sensed power level in the other branch, normally in response to the sensed forward power level, whereby the dynamic range required for power sensing may be reduced considerably. Further features of such a method are stated in the claims 2–4.

A measurement device according to the invention is characterized in that the power sensing circuit in one branch is connected to a means, e.g. a controllable attenuator, for adjusting the sensing range of power levels to be sensed in the power sensing circuit in the other branch. Further advantageous features are stated in the claims 6 through 16.

BRIEF DESCRIPTION OF THE DRAWINGS

The invention will be explained further below with reference to the appended drawings illustrating a prior art device, as discussed above, and various embodiments of a measuring device according to the invention.

DETAILED DESCRIPTION OF PREFERRED EMBODIMENTS

Figure 1:
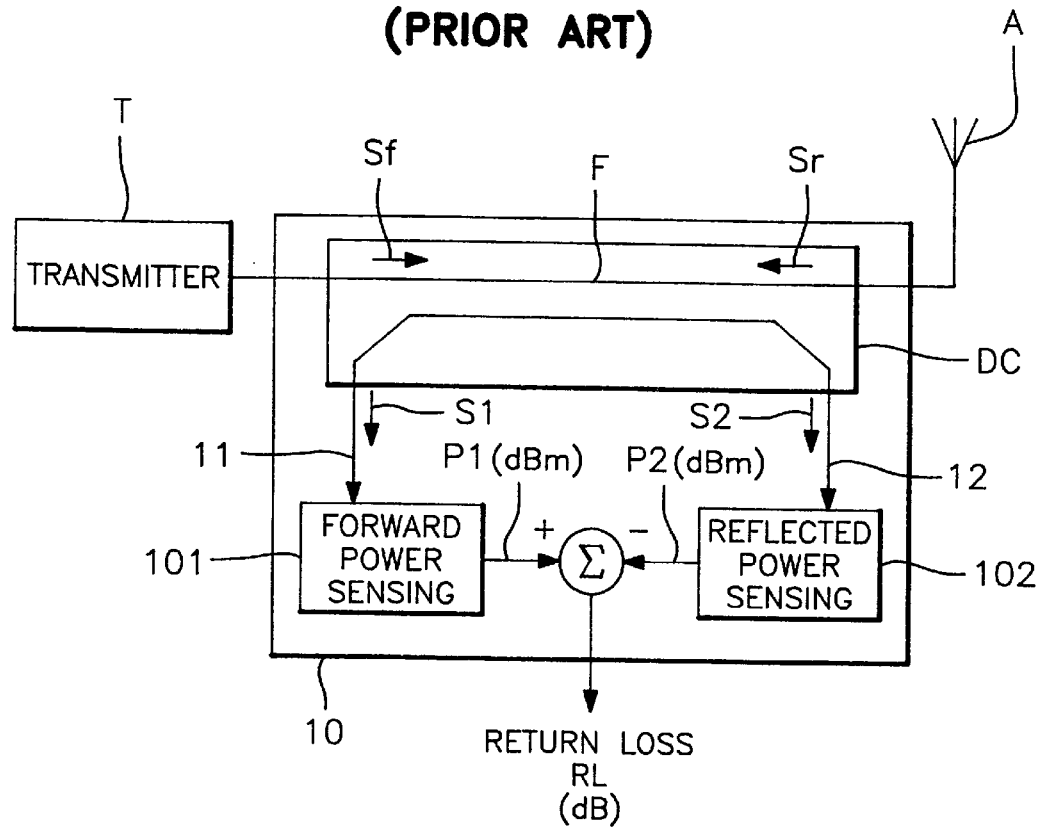
FIG. 1 illustrates schematically a prior art device for measuring the return loss of a radiofrequent signal at a feeding circuit between a transmitter and an antenna, as discussed above.

The present invention concerns an improvement over the prior art method and device illustrated in FIG. 1, the improvement being related to the dynamic range required for the power sensing circuits 101, 102 incorporated in the measurement device 10.

Figure 2:
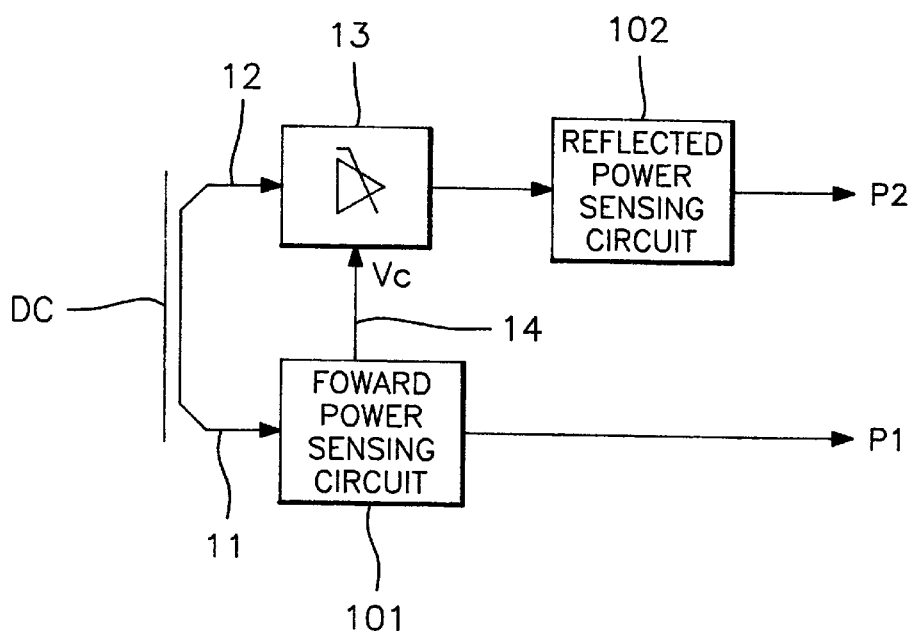
FIG. 2 illustrates schematically two branches of a measurement device according to the invention.

As illustrated schematically in FIG. 2, the improvement involves an interaction between the two output branches 11, 12 of the directional coupler DC (FIG. 1), whereby the sensing range in one branch, viz. the branch 12 for sensing reflected power, can be adjusted in response to the power level sensed in the other branch, viz. the branch 11 for sensing forward power. For this purpose, the forward power sensing circuit 101 is connected to an adjustment means in the form of a controllable attenuator 13, the output of which is connected to the reflected power sensing circuit 102.

On the output 14 connected to the controllable attenuator 13, the forward power sensing circuit 101 will provide a control voltage Vc as a function of the sensed forward power P1 (compare FIG. 1). With increasing forward power levels P1, the control voltage Vc is also increased, and the whole range of reflected power levels that can be sensed or measured in the reflected power sensing circuit 102 is thereby shifted to higher values, e.g. to a range between 5 and 40 dBm, in the example discussed above. When a low forward power is sensed, on the other hand, the control voltage Vc will be lower, and the range of reflected power levels is now shifted to lower values, e.g. between −10 and 25 dBm. Consequently, thanks to the range shift of 15 dB, the required dynamic range is reduced from 50 dB to 35 dB in the reflected power sensing circuit 102. Naturally, if the range could be shifted so as to exactly follow the forward power, the required dynamic range would be reduced to the same value as ΔRL, viz. 20 dB in the example given above.

Figure 3:
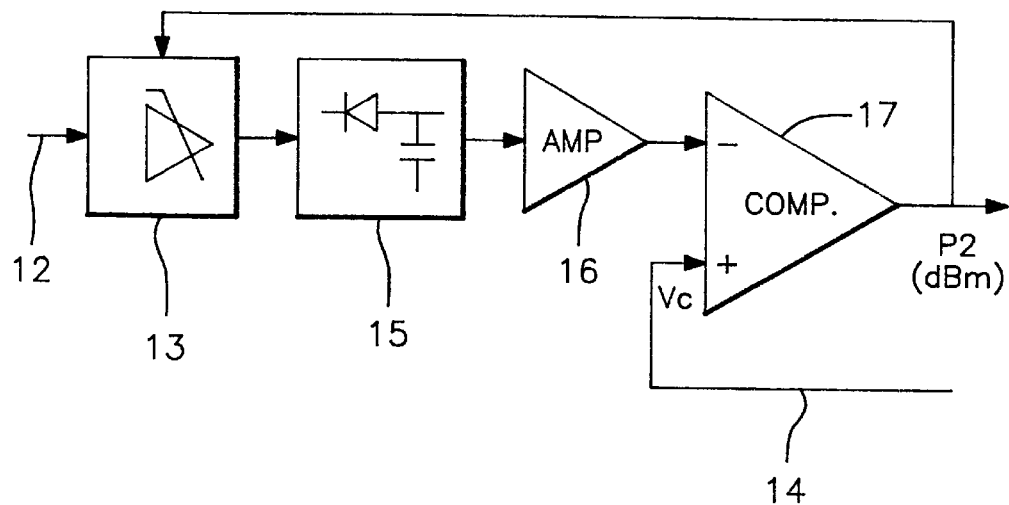
FIG. 3 illustrates a preferred embodiment of one of the branches shown schematically in FIG. 2.

The controlled range reduction can be implemented in various ways by those skilled iii the art. In principle, a direct open control, as indicated schematically in FIG. 2, is possible. However, it is generally advantageous to use a feed back loop in each branch 11, 12 or at least in the branch 12 in which the power range is to be reduced. FIG. 3 illustrates an example where the power sensing circuit (102 in FIG. 2) comprises a diode detector 15, in particular a Schottky detector, for sensing the power level (such detectors having a dynamic range of about 30 dB are commercially available), an amplifier 16, and a differential amplifier or comparator 17. The inverting input of the latter is connected to the amplifier 16, whereas the non-inverting or reference input is coupled to the control connection 14 on which the control voltage Vc is applied from the other branch. The output of the comparator 17 is fed back to the controllable attenuator 13, whereby the circuit will be stabilized in response to the control voltage Vc. When the control voltage Vc is changed, the quiescent point of the detector is moved along the diode curve, typically with an output voltage varying between 1 mV and 1 V over a 30 dB dynamic range. The lower sensitivity limit or sensitivity floor is raised approximately 3 dB for every doubling of the control voltage.

Now, three complete embodiments of the measurement device according to the invention will be briefly described with reference to FIGS. 4 through 6.

Figure 4:
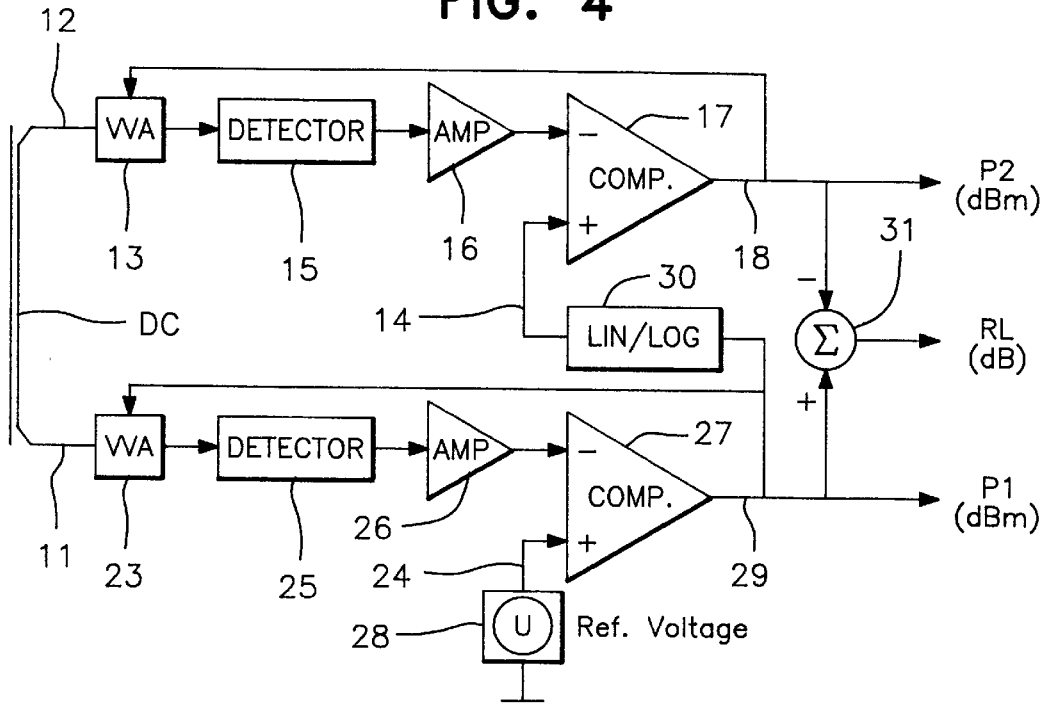
FIG. 4 illustrates a first embodiment of a complete measurement device according to the invention.

In the first embodiment shown in FIG. 4, both output branches 11, 12 from the directional coupler DC (compare FIG. 1) are structured like the feed back configuration of FIG. 3 with a voltage variable attenuator 13 and 23, respectively, a diode detector 15 and 25, respectively, preferably a zero bias detector, an amplifier 16 and 26, respectively, and a comparator 17 and 27, respectively. The reference input 24 of the comparator 27 is connected to a reference voltage source 28, whereas the analogue output 29 of the comparator 27 provides a voltage corresponding to the forward power P1. The output 29 is connected to the reference input 14 of the comparator 17 (in the reflecting power sensing circuit in the branch 12) via a lin/log converter 30. Thus, the power range given by the voltage variable attenuator 13 is shifted in response to the output voltage at 29 corresponding to the sensed forward power. The return loss RL is obtained as an analogue output from a subtraction circuit 31 coupled to the comparator outputs 29 and 18.

Figure 5:
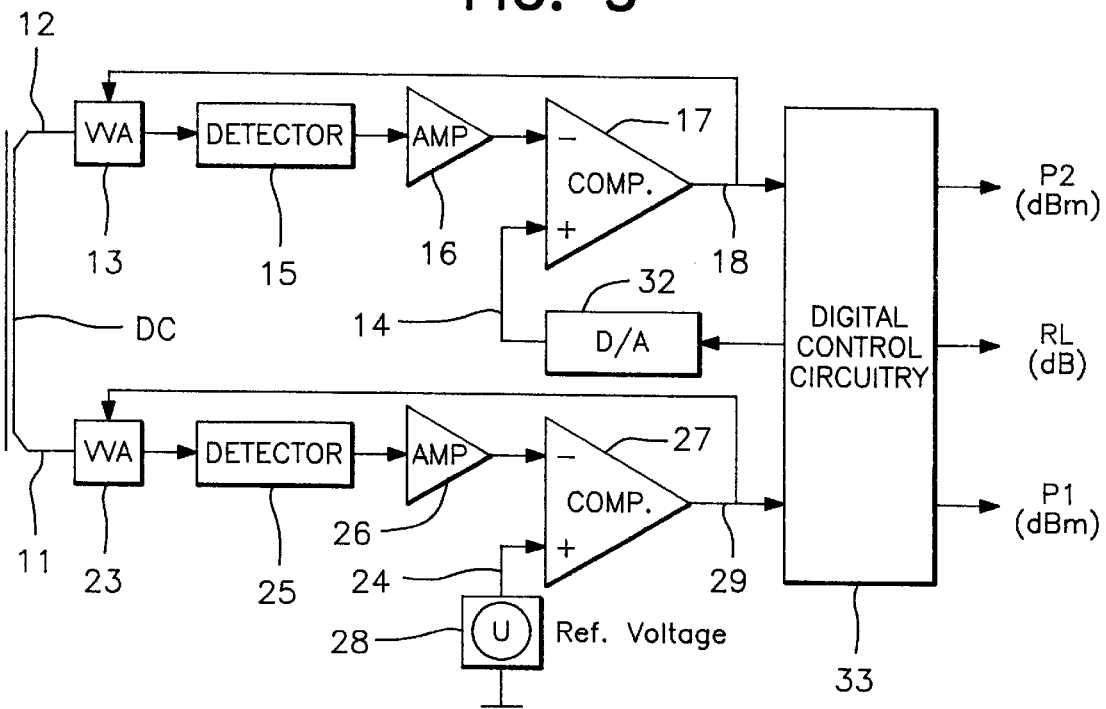
FIG. 5 illustrates a second embodiment of a complete measurement device according to the invention.

The measurement device shown in FIG. 5 is basically the same but is provided with a digital output part. The outputs 18 and 29 of the comparators 17 and 17 are connected to a digital control circuit 33 for processing the output values corresponding to the sensed power levels. Thus, the return loss value is calculated as indicated in the example discussed above and appears at the output of the circuit 33 along with the power values P1 and P2 representing the forward and reflected power, respectively.

The interaction between the two branches 11, 12 is accomplished by way of a connection between the digital control circuit 33 and the control input 14 of the comparator 17 via a D/A converter 32.

Figure 6:
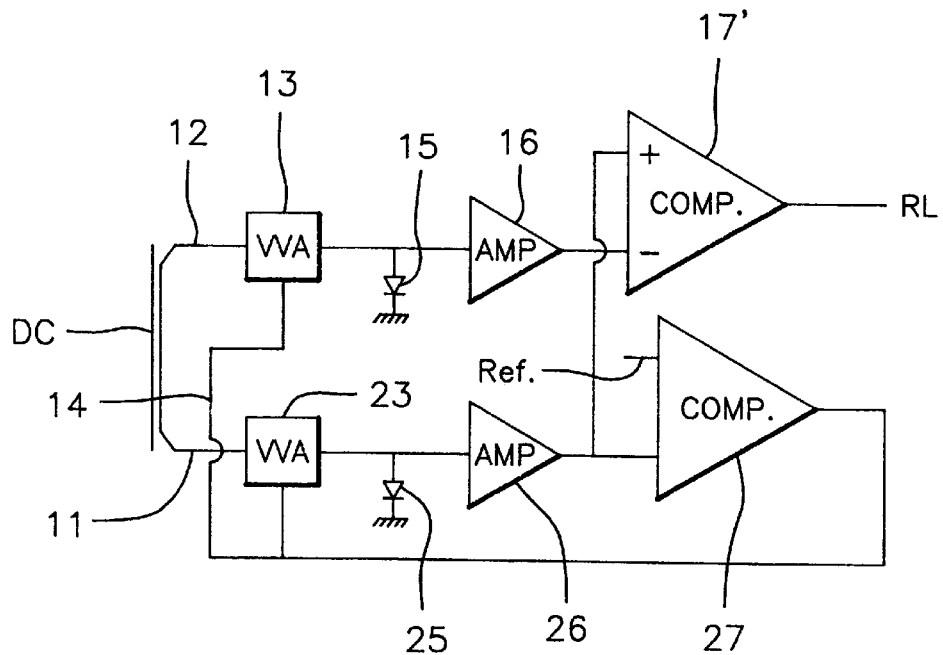
FIG. 6 illustrates a third embodiment of a complete measurement device according to the invention.

A third embodiment, shown i FIG. 6, is a simple, totally analogue circuit which is similar to the two embodiments shown in FIGS. 4 and 5. However, there are two substantial differences. Firstly, in the branch 11 for sensing the forward power, the output of the comparator 27 is fed back to the voltage controlled attenuators 23 and 13 in both branches 11, 12, whereby the dynamic range adjustment is accomplished by a direct connection 14. Secondly, at the output side, the comparator 17' in the branch 12 for sensing reflected power is a logarithmic device, which provides directly at its analogue output a voltage corresponding to the desired return loss value RL (dB). The inputs of the logarithmic comparator 17' are connected directly to the respective amplifiers 16 and 26.

The desired embodiments, in particular the third embodiment, have several advantages, viz. a high dynamic range, a small number of components, self-balancing and virtually without problems due to temperature drift, and a low total cost.

We claim:

1. A method of measuring the return loss of a radio frequency signal at a feeding circuit coupled to a load, comprising sensing forward power and reflected power by a measuring circuit having first and second branches for transferring a derived forward signal and a derived reflected signal, respectively, and the return loss is calculated on the basis of the sensed power levels of said derived signals in said first and second branches, and adjusting the sensing range of power levels sensed in one branch in response to the sensed power level in the other branch, whereby the dynamic range required for power sensing in said measuring circuit is reduced.

2. The method as defined in claim 1, wherein said sensing range is adjusted by shifting the range as a whole.

3. The method as defined in claim 1, wherein said sensing range is adjusted in said second branch for transferring a derived reflected signal.

4. The method as defined in claim 1, wherein said sensing range is adjusted to higher power levels of said derived reflected signal when the sensed power level of said derived forward signal is increased and vice versa.

5. A measurement device for measuring the return loss of a radiofrequency signal at a feeding circuit coupled to a load, comprising a directional coupler having first and second branches for transferring a derived forward signal and a derived reflected signal, respectively, a forward power sensing circuit inserted in said first branch, a reflected power sensing circuit inserted in said second branch, and means for calculating the return loss on the basis of the power levels sensed in said first and second branches, wherein the forward power sensing circuit in said first branch is connected to a means for adjusting the sensing range of power levels to be sensed in the reflected power sensing circuit in the second branch, whereby the dynamic range required for power sensing in said reflected power sensing circuit is reduced.

6. The measurement device as defined in claim 5, wherein each of said forward power sensing circuit and said reflected power sensing circuit comprises at least one diode detector.

7. The measurement device as defined in claim 6, wherein said diode detector is a Schottky detector.

8. The measurement device as defined in claim 6, wherein said diode detector is a zero bias detector.

9. The measurement device as defined in claim 5, wherein said adjusting means is a controllable attenuator, the output of which is connected to said power sensing circuit.

10. The measurement device as defined in claim 9, wherein at least one of said first and second branches comprises a controllable attenuator and a detector.

11. The measurement device as defined in claim 5, wherein at least one of said first and second branches comprises a feed back loop.

12. The measurement device as defined in claim 11, wherein said feed back loop comprises a differential amplifier.

13. The measurement device as defined in claim 12, wherein a reference input of said differential amplifier in said one branch is connected to the power sensing circuit of the other branch.

14. The measurement device as defined in claim 13, wherein said reference input is connected to an analogue output (29) of said power sensing circuit of the other branch.

15. The measurement device as defined in claim 13, wherein said reference input is connected to a digital control circuit.

16. The measurement device as defined in claim 13, wherein said differential amplifier is a logarithmic device providing directly at its output a voltage corresponding to the desired return loss value.

* * * * *